US008796789B2

(12) United States Patent
Uto et al.

(10) Patent No.: US 8,796,789 B2
(45) Date of Patent: Aug. 5, 2014

(54) PHYSICAL QUANTITY SENSOR AND METHOD OF MAKING THE SAME

(71) Applicant: Alps Electric Co., Ltd., Tokyo (JP)

(72) Inventors: Yoshitaka Uto, Tokyo (JP); Akira Miyatake, Tokyo (JP); Toru Takahashi, Tokyo (JP); Toshihiro Kobayashi, Tokyo (JP); Chiaki Kera, Tokyo (JP); Hisayuki Yazawa, Tokyo (JP); Hisanobu Okawa, Tokyo (JP)

(73) Assignee: Alps Electric Co., Ltd., Tokyo (JP)

( * ) Notice: Subject to any disclaimer, the term of this patent is extended or adjusted under 35 U.S.C. 154(b) by 6 days.

(21) Appl. No.: 13/744,951

(22) Filed: Jan. 18, 2013

(65) Prior Publication Data

US 2013/0126987 A1 May 23, 2013

Related U.S. Application Data

(63) Continuation of application No. PCT/JP2011/066656, filed on Jul. 22, 2011.

(30) Foreign Application Priority Data

Jul. 27, 2010 (JP) ................................ 2010-167761
Jan. 21, 2011 (JP) ................................ 2011-010919

(51) Int. Cl.
*H01L 27/14* (2006.01)

(52) U.S. Cl.
USPC ............................................ 257/414; 438/48

(58) Field of Classification Search
USPC ............................................ 257/414; 438/48
See application file for complete search history.

(56) References Cited

U.S. PATENT DOCUMENTS

2003/0155622 A1 8/2003 Ishibashi et al.
2007/0089525 A1 4/2007 Momose et al.

FOREIGN PATENT DOCUMENTS

| | | |
|---|---|---|
| EP | 2346083 | 7/2011 |
| JP | 07-128364 | 5/1995 |
| JP | 2007-266320 | 10/2007 |
| JP | 2010-145212 | 7/2010 |
| WO | 2010-032819 | 3/2010 |

OTHER PUBLICATIONS

International Search Report for PCT/JP2011/066656 mailed Aug. 23, 2011.

*Primary Examiner* — Douglas Menz
(74) *Attorney, Agent, or Firm* — Hunton & Williams LLP

(57) ABSTRACT

A first sealing layer having a frame-like shape and a first contact layer are formed on a back surface of a frame portion of a sensor substrate. The first contact layer is separated from the first sealing layer, extends through a functional member and an insulation layer, and is electrically connected to the functional member and a first base member. A second sealing layer and a second contact layer are formed on a surface of a wiring substrate. The second sealing layer faces the first sealing layer. The second contact layer is separated from the second sealing layer, extends through the insulation layer, and is electrically connected to the second base member. The sealing layers are eutectically bonded to each other. The contact layers are electrically connected to each other, and thereby the first and second base members and the frame portion have the same potential.

13 Claims, 10 Drawing Sheets

PHYSICAL QUANTITY SENSOR AND METHOD OF MAKING THE SAME

CLAIM OF PRIORITY

This application is a Continuation of International Application No. PCT/JP2011/066656 filed on Jul. 22, 2011, which claims benefit of Japanese Patent Application No. 2010-167761 filed on Jul. 27, 2010 and No. 2011-010919 filed on Jan. 21, 2011. The entire contents of each application noted above are hereby incorporated by reference.

BACKGROUND OF THE INVENTION

1. Field of the Invention

The present invention relates to a physical quantity sensor made by microfabricating a silicon substrate, and in particular, to a physical quantity sensor having high hermeticity and high electrical stability.

2. Description of the Related Art

Japanese Unexamined Patent Application Publication No. 2007-266320 discloses an invention related to a sensor module. The sensor module includes a sensor substrate, and an electrode-forming substrate and a circuit-forming substrate, respectively facing upper and lower surfaces of the sensor substrate. The electrode-forming substrate and the circuit-forming substrate are bonded to the sensor substrate through metal sealing layers. Gaps between these substrates are sealed by Au—Au bonding, which is room temperature bonding.

A via hole extends through each of the sensor substrate and the electrode-forming substrate from an upper surface to a lower surface thereof. According to Japanese Unexamined Patent Application Publication No. 2007-266320, the via holes are electrically insulated from the substrates.

The technology for sealing gaps between substrates with a metal, which is described in Japanese Unexamined Patent Application Publication No. 2007-266320, is also disclosed in International Publication No. WO2003/001217.

As described in Japanese Unexamined Patent Application Publication No. 2007-266320, a physical quantity sensor includes a plurality of silicon substrates that are stacked with insulation layers therebetween, and each of the silicon substrates is in an electrically floating state (is not electrically connected to any other parts). Therefore, there is a problem in that it is difficult to improve the electrical stability of the physical quantity sensor, because the physical quantity sensor has a large parasitic capacity and is likely to generate noise.

A physical quantity sensor includes a movable portion for detecting a change in physical quantity and a frame portion surrounding the movable portion. The movable portion occupies a large space in the middle of the physical quantity sensor. Gaps between upper and lower surfaces of the frame portion and substrates having insulation layers thereon are sealed (see Japanese Unexamined Patent Application Publication No. 2007-266320). Therefore, a structure for reducing parasitic capacity and improving electrical stability needs to be disposed in a very limited region outside of the movable portion. Moreover, it is necessary to avoid negative influence on metal sealing layers for sealing the gaps between the substrates, which are disposed near this region.

SUMMARY OF THE INVENTION

The present invention provides a physical quantity sensor having high hermeticity and high electrical stability.

According to a first aspect of the present invention, provided is a physical quantity sensor including an electroconductive first base member, an electroconductive second base member, an electroconductive functional member including: a movable portion disposed between the first base member and the second base member; and a frame portion surrounding the movable portion, a detection portion configured to detect displacement of the movable portion, a first insulation layer bonding the frame portion and the first base member to each other, a first metal layer formed on a facing surface of the functional member facing the second base member, a second insulation layer formed on a facing surface of the second base member facing the functional member, and a second metal layer formed on a surface of the second insulation layer. The first metal layer includes a first sealing layer formed on the facing surface of the frame portion and having a frame-like shape, and a first contact layer separated from the first sealing layer, extending through the functional member and the first insulation layer, and electrically connected to the frame portion and the first base member. The second metal layer includes a second sealing layer formed at a position at which the second sealing layer faces the first sealing layer, and a second contact layer separated from the second sealing layer, extending through the second insulation layer, and electrically connected to the second base member. A gap between the frame portion and the second base member is sealed by eutectically bonding the first sealing layer and the second sealing layer to each other. The first contact layer and the second contact layer, respectively separated from the first sealing layer and the second sealing layer, are electrically connected to each other, and thereby the first base member, the second base member, and the frame portion are made to have the same potential.

According to a second aspect of the present invention, provided is a method of making a physical quantity sensor. The physical quantity sensor includes an electroconductive first base member, an electroconductive second base member, an electroconductive functional member including: a movable portion disposed between the first base member and the second base member; and a frame portion surrounding the movable portion, a detection portion configured to detect displacement the movable portion, and a first insulation layer bonding the frame portion and the first base member to each other. The method includes forming a first metal layer on a facing surface of the functional member facing the second base member so that the first metal layer includes a first sealing layer formed on the facing surface of the frame portion and having a frame-like shape, and a first contact layer separated from the first sealing layer, extending through the functional member and the first insulation layer, and electrically connected to the frame portion and the first base member; forming a second metal layer on a surface of a second insulation layer formed on a facing surface of the second base member facing the functional member so that the second metal layer includes a second sealing layer formed at a position at which the second sealing layer faces the first sealing layer, and a second contact layer separated from the second sealing layer, extending through the second insulation layer, and electrically connected to the second base member; and eutectically bonding the first sealing layer and the second sealing layer to each other, and making the first base member, the second base member, and the frame portion have the same potential by electrically connecting the first contact layer and the second contact layer, respectively separated from the first sealing layer and the second sealing layer, to each other.

With the present invention, the first sealing layer and the first contact layer are formed so as to be separated from each other, and the second sealing layer and the second contact layer are formed so as to be separated from each other. With the present invention, an insulation layer is disposed between the first base member and the functional member and an insulation layer is disposed on a surface of the second base member. Thus, the base members are each in an electrically floating state. Therefore, with the present invention, the contact layers, which are separated from the sealing layers, are electrically connected to the base members through the insulation layers; the first contact layer and the second contact layer are electrically connected to each other; and thereby the first base member, the second base member, and the frame portion the functional member excluding the movable portion (electrode portion) can be made to have the same potential. By using the contact layers, which extend through the insulation layers, for electrical connection, the limited area in the physical quantity sensor can be efficiently used, and thereby the physical quantity sensor can be reduced in size.

In contrast to the present invention, Japanese Unexamined Patent Application Publication No. 2007-266320 does not disclose a structure for making the substrates, which are stacked with the insulation layer therebetween, to have the same potential. The sealing layers are bonded to each other by using room temperature Au—Au bonding, which is different from eutectic bonding used in the present invention.

Here, a structure in which the first sealing layer and the first contact layer and the second sealing layer and the second contact layers are not respectively separated from each other but integrally formed with each other will be called a comparative example. First, a problem with the comparative example will be described.

In the case of the comparative example, when eutectically bonding the first sealing layer and the second sealing layer to each other, a metal that caused a eutectic reaction becomes deformed by receiving a bonding pressure and a part of one of a first metal and a second metal that easily softens flows toward the contact layers. Thus, a void is formed in the sealing layers, gas and liquid are likely to leak into the sensor through the void, and the reliability of the sensor is likely to decrease.

In contrast, with the present invention, the first sealing layer and the first contact layer are separated from each other, and the second sealing layer and the second contact layer are separated from each other. Therefore, when eutectically bonding the first sealing layer and the second sealing layer to each other, a metal that caused a eutectic reaction can be prevented from flowing toward the contact layers. Thus, the first sealing layer and the second sealing layer can be eutectically bonded to each other appropriately, and the gap between the frame portion of the functional member and the second base member can be appropriately sealed.

Thus, with the present invention, as compared with existing technologies, improvement of the electrical stability of the physical quantity sensor, such as reduction of parasitic capacity and reduction of noise, can be achieved. Moreover, a metal that caused a eutectic reaction for eutectic bonding is prevented from flowing from the position of a sealing layer toward a contact layer, a gap between the substrates can be appropriately sealed, and thereby the reliability of the physical quantity sensor can be improved.

In the present invention, it is preferable that the first metal layer further include a first electrical connection layer directly or indirectly electrically connected to the first contact layer, the second metal layer further include a second electrical connection layer integrally formed with the second contact layer, and the first electrical connection layer and the second electrical connection layer be eutectically bonded to each other, and thereby the first contact layer and the second contact layer be electrically connected to each other through the first electrical connection layer and the second electrical connection layer. In this case, the first contact layer and the second contact layer can be electrically connected to each other with a simple structure.

In the present invention, it is preferable that the first and second contact layers and the first and second electrical connection layers be formed between the movable portion and the first and second sealing layers in plan view. In this case, the physical quantity sensor can be reduced in size.

In the present invention, it is preferable that the first electrical connection layer and the second electrical connection layer have different lengths, and a protruding bonding stopper portion be formed on a shorter one of the first and second electrical connection layers at a position at which the bonding stopper portion faces a longer one of the first end second electrical connection layers. In this case, during eutectic bonding, the substrates can be prevented from being pressed with a pressure larger than a predetermined pressure, and stable eutectic bonding can be performed.

In the present invention, it is preferable that the first sealing layer and the second sealing layer each have four corners having curved shapes. In the present invention, it is preferable that the first sealing layer and the second sealing layer each have a substantially constant width. In this case, the bonding pressure can be made substantially uniform over the entire bonding surface of the sealing layers, an unbonded region or a void can be prevented from being generated in the bonding surface, and the entireties of the sealing layers can be appropriately bonded to each other.

It is preferable that the first metal layer include Ge, Mg, or Zn and the second metal layer include Al or an Al alloy, or the second metal layer include Ge, Mg, or Zn and the first metal layer include Al or an Al alloy. Al or an Al alloy easily softens during eutectic bonding, and with the comparative example described above, Al or an Al alloy is likely to flow into the contact layers. In contrast, with the present invention, the contact layers are separated from the sealing layers, and therefore Al or an Al alloy is prevented from flowing from the sealing layers toward the contact layers.

BRIEF DESCRIPTION OF THE DRAWINGS

FIG. 10A is a partially transparent view illustrating a back side of a functional member, and FIG. 10B is a partial plan view illustrating a front side of a wiring substrate;

DESCRIPTION OF THE PREFERRED EMBODIMENTS

Figure 1:
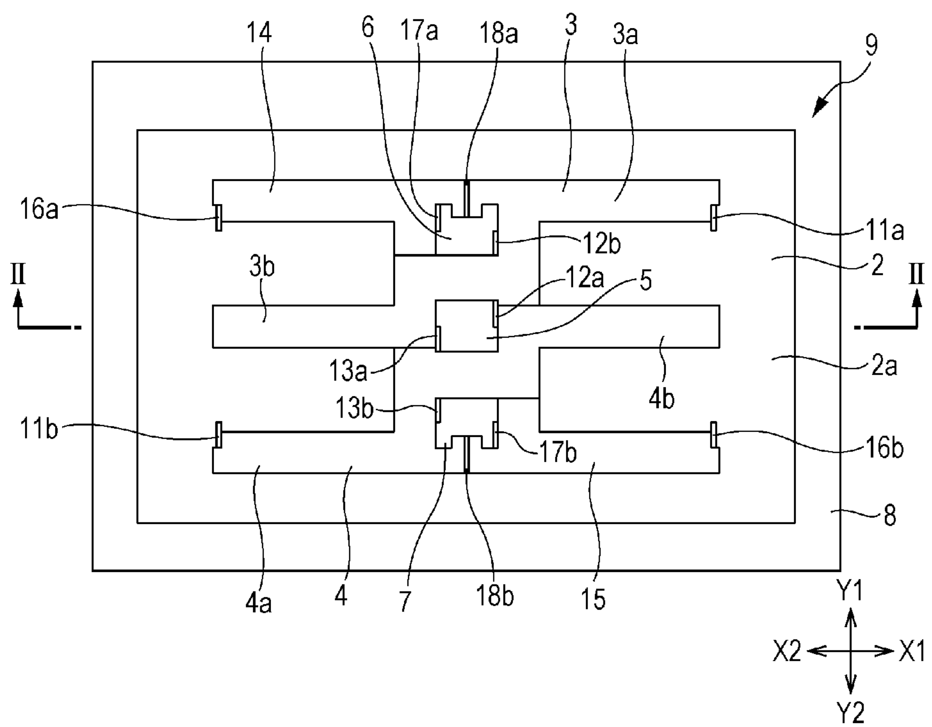
FIG. 1 is a plan view of a physical quantity sensor according to a first embodiment of the present invention (plan view of a functional member)

Regarding physical quantity sensors illustrated in the drawings, the Y direction is the left-right direction, the Y1 direction is the leftward direction, the Y2 direction is the rightward direction, the X direction is the front-back direction, the X1 direction is the forward direction, and the X2 direction is the backward direction. The up-down direction (Z direction; height direction) is a direction that is perpendicular to both the Y direction and the X direction.

Figure 3:
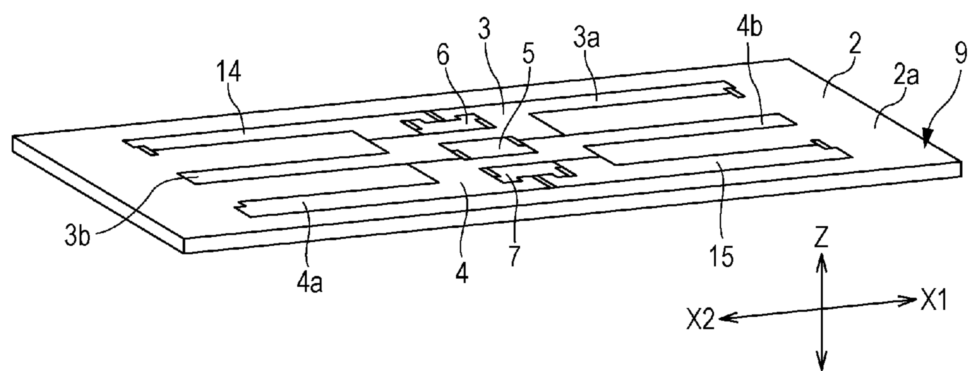
FIG. 3 is a perspective view of the physical quantity sensor according to the present embodiment when the physical quantity sensor is at rest under weightless conditions.

A physical quantity sensor illustrated in FIG. 1 includes an electroconductive functional member 9 (silicon substrate) having, for example, a rectangular plate-like shape. Components of the functional member 9 are formed as follows. First, resist layers having planar shapes corresponding to the shapes of components are formed on the functional member 9. Then, the components are formed so as to be separated from one another by cutting the silicon substrate at portions at which the resist layers are not present through an etching process such as deep RIE (deep reactive ion etching). Therefore, the components formed in the functional member 9 of the physical quantity sensor are disposed within a thickness between the front surface and the back surface of the silicon substrate. Referring to FIG. 3 (in which a frame portion 8 illustrated in FIG. 1 is not illustrated), when the physical quantity sensor is at rest under weightless conditions, the entirety of front surface of the functional member 9 and the entirety of the back surface of the functional member 9 are respectively planar, and there are no parts protruding from the front and back surfaces. However, in practice, the functional member 9 is slightly displaced due to the influence of gravity even in a stationary state, because the physical quantity sensor is used on earth.

As illustrated in FIG. 1, the functional member 9 of the physical quantity sensor includes a movable portion 2 and the frame portion 8 surrounding the movable portion 2.

As illustrated in FIGS. 1 and 3, the movable portion 2 includes a weight portion 2*a* and first to fourth rotatable supporting portions 3, 4, 14, and 15, which are disposed inside of the weight portion 2*a*. The weight portion 2*a* is displaceable in the height direction (Z direction). As illustrated in FIGS. 1 and 3, the first and second rotatable supporting portions 3 and 4 are crank-shaped in plan view.

As illustrated in FIG. 1, the first rotatable supporting portion 3 includes a connection arm 3*a* and a leg portion 3*b*, which are integrally formed. The connection arm 3*a* extends forward (in the X1 direction), and the leg portion 3*b* extends backward (in the X2 direction). As illustrated in FIG. 1, the second rotatable supporting portion 4 includes a connection arm 4*a* and a leg portion 4*b*, which are integrally formed. The connection arm 4*a* extends backward (in the X2 direction), and the leg portion 4*b* extends forward (in the X1 direction).

The connection arms 3*a* and 4*a* and the leg portions 3*b* and 4*b*, each having a predetermined width, extend in the front-back direction (X1-X2 direction) away from middle, left, and right anchor portions 5, 6, and 7.

As illustrated in FIG. 1, the middle, left, and right anchor portions 5, 6, and 7 are disposed inside of the movable portion 2. The anchor portions 5 to 7 are arranged in the left-right direction (Y direction) with a predetermined distance therebetween. The anchor portions 5 to 7 have substantially the same width in the front-back direction (X direction).

Figure 2:
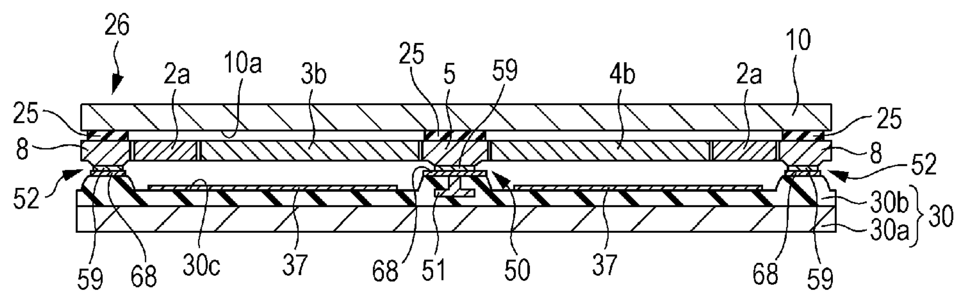
FIG. 2 is a partial longitudinal sectional view of the physical quantity sensor taken along line II-II of FIG. 1.

FIG. 2 is a partial longitudinal sectional view of the physical quantity sensor taken along line II-II of FIG. 1. As illustrated in FIG. 2, the anchor portion 5 is immovably supported by a first base member 10 via an oxide insulation layer 25 ($SiO_2$ layer; first insulation layer). The same applies to the anchor portions 6 and 7, which are not illustrated in FIG. 2.

The frame portion 8, which surrounds the movable portion 2, is immovably supported by the first base member 10 via the oxide insulation layer 25 ($SiO_2$ layer).

The first base member 10, which is electroconductive, is, for example, a silicon substrate. The oxide insulation layer 25 is not disposed on a region facing the movable portion 2. The first base member 10; the oxide insulation layer 25; and the functional member 9, which includes the movable portion 2, the anchor portions 5 to 7, and the frame portion 8 illustrated in FIG. 1, are, for example, SOI substrates. The first base member 10, the oxide insulation layer 25, and the functional member 9 constitute a sensor substrate 26.

As illustrated in FIG. 1, an end of the connection arm 3*a* of the first rotatable supporting portion 3 is rotatably connected to the weight portion 2*a* through a joint 11*a*. An end of the connection arm 4*a* of the second rotatable supporting portion 4 is rotatably connected to the weight portion 2*a* through a joint 11*b*.

As illustrated in FIG. 1, the connection arm 3*a* of the first rotatable supporting portion 3 is rotatably connected to the left anchor portion 6 through a fulcrum joint 12*b* and to the middle anchor portion 5 through a fulcrum joint 12*a*. As illustrated in FIG. 1, the connection arm 4*a* of the second rotatable supporting portion 4 is rotatably connected to the right anchor portion 7 through a fulcrum joint 13*b* and to the middle anchor portion 5 through a fulcrum joint 13*a*.

The physical quantity sensor according to the embodiment illustrated in FIG. 1 further includes a third rotatable supporting portion 14 and a fourth rotatable supporting portion 15. The third rotatable supporting portion 14 is disposed in the backward direction (X2 direction) of the left anchor portion 6 so as to be separated from the weight portion 2*a* and the left anchor portion 6. The fourth rotatable supporting portion 15 is disposed in the forward direction (X1 direction) of the right anchor portion 7 so as to be separated from the weight portion 2*a* and the right anchor portion 7.

As illustrated in FIG. 1, an end of the third rotatable supporting portion 14 is rotatably connected to the weight portion 2*a* through a joint 16*a*. An end of the fourth rotatable supporting portion 15 is rotatably connected to the weight portion 2*a* through a joint 16*b*. As illustrated in FIG. 1, the third rotatable supporting portion 14 is rotatably connected to the left anchor portion 6 through a fulcrum joint 17*a*. The fourth rotatable supporting portion 15 is rotatably connected to the right anchor portion 7 through a fulcrum joint 17*b*.

As illustrated in FIG. 1, the connection arm 3*a* of the first rotatable supporting portion 3 is connected to the third rotatable supporting portion 14 through a joint 18*a*. As illustrated in FIG. 1, the connection arm 4*a* of the second rotatable supporting portion 4 is connected to the fourth rotatable supporting portion 15 through a joint 18*b*.

Each of the joints 11*a*, 11*b*, 16*a*, and 16*b* and the fulcrum joints 12*a*, 13*a*, 13*b*, and 17*b* includes a torsion bar (spring portion) made by cutting a silicon substrate into a narrow bar by etching the substrate.

As illustrated in FIG. 2, the physical quantity sensor includes the first base member 10 and a wiring substrate 30, which are disposed on different sides of the weight portion 2*a* so as to be spaced apart from the weight portion 2*a* in the height direction. As illustrated in FIG. 2, a fixed electrode 37 is disposed on a surface of the wiring substrate 30. The wiring substrate 30 includes an electroconductive second base member 30*a* (silicon substrate) and an insulation layer 30*b* (second insulation layer) formed on the second base member 30*a*. The fixed electrode 37 is formed by sputtering an electroconductive metal material onto a surface of the insulation layer 30*b* or by plating the surface with the electroconductive metal material. The weight portion 2*a* functions as a movable electrode, and weight portion 2*a* and the fixed electrode 37 constitute a detection portion.

As illustrated in FIG. 2, each of the anchor portions 5 to 7 is eutectically bonded to the wiring substrate 30 through a metal bonding layer 50. A wiring layer 51 is formed in the insulation layer 30*b* of the wiring substrate 30. The wiring layer 51 is electrically connected to the bonding layer 50 and is drawn to the outside through the inside of the insulation layer 30*b* (not shown).

As illustrated in FIG. 2, the frame portion 8 is eutectically bonded to the wiring substrate 30 through a metal sealing layer 52.

As illustrated in FIG. 3, when an external force (acceleration or the like) is not acting on the physical quantity sensor under weightless conditions, the surfaces of all components of the functional member 9 are maintained in the same plane due to elastic recovery forces of the torsion bars (spring portions) disposed in the fulcrum joints and the joints. However, when the physical quantity sensor is practically used, even under such conditions, the surfaces of the components are slightly displaced from each other due to the influence of gravity of the earth.

Figure 4:
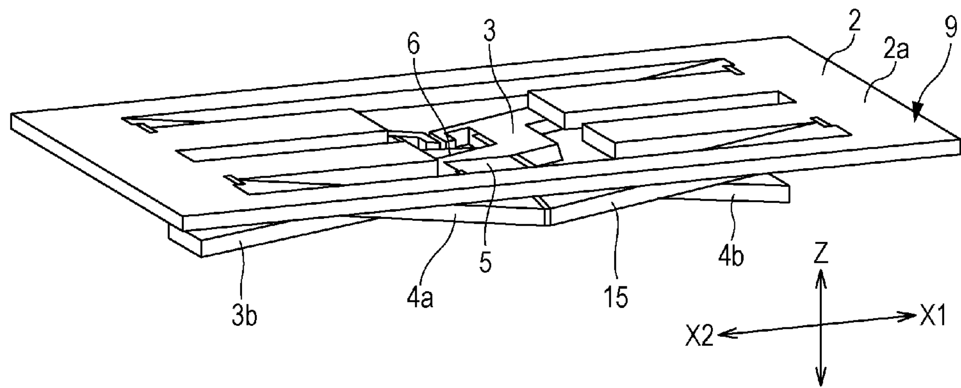
FIG. 4 is a perspective view of the physical quantity sensor according to the present embodiment when the physical quantity sensor is operating.

For example, when acceleration is applied to the physical quantity sensor from the outside, the acceleration acts on the weight portion 2*a*, the anchor portions 5 to 7, and the frame portion 8. At this time, the weight portion 2*a* tends to remain in the absolute space due to an inertial force. As a result, the weight portion 2*a* moves relative to the anchor portions 5 to 7 in a direction opposite to the direction in which the acceleration is applied. Then, as illustrated in FIG. 4, the weight portion 2*a* tends to move in the height direction from the position in a stationary state illustrated in FIG. 3 due to an inertial force. As a result, the first rotatable supporting portion 3 rotates around the fulcrum joints 12*a* and 12*b* in the height direction, the second rotatable supporting portion 4 rotates around the fulcrum joints 13*a* and 13*b* in the height direction, the third rotatable supporting portion 14 rotates around the fulcrum joint 17*a* in the height direction, and the fourth rotatable supporting portion 15 rotates around the fulcrum joint 17*b* in the height direction. During this rotational movement, the torsion bars of the joints 11*a*, 11*b*, 16*a*, 16*b*, 18*a*, and 18*b* and the torsion bars of the fulcrum joints 12*a*, 12*b*, 13*a*, 13*b*, 17*a*, and 17*b* become torsionally deformed.

With the support mechanism for supporting the weight portion 2*a* according to the present embodiment, the weight portion 2*a* can effectively perform translational motion in the height direction (Z direction).

With the present embodiment, when the physical quantity changes, the leg portions 3*b* and 4*b* protrude in a direction opposite to a direction in which the weight portion 2*a* is displaced. Ends of the leg portions 3*b* and 4*b* contact a surface 30*c* (stopper surface) of the wiring substrate 30 before the weight portion 2*a* contacts a surface 10*a* of the first base member 10 illustrated in FIG. 2, and thereby the displacement of the weight portion 2*a* in the height direction is restrained.

As described above, the embodiment illustrated in FIG. 1 includes the leg portions 3*b* and 4*b*, which are displaceable in a direction opposite to the direction in which the weight portion 2*a* becomes displaced. The leg portions 3*b* and 4*b* serve as a stopper mechanism for restraining the displacement of the weight portion 2*a* in the height direction (Z direction).

Figure 5A:
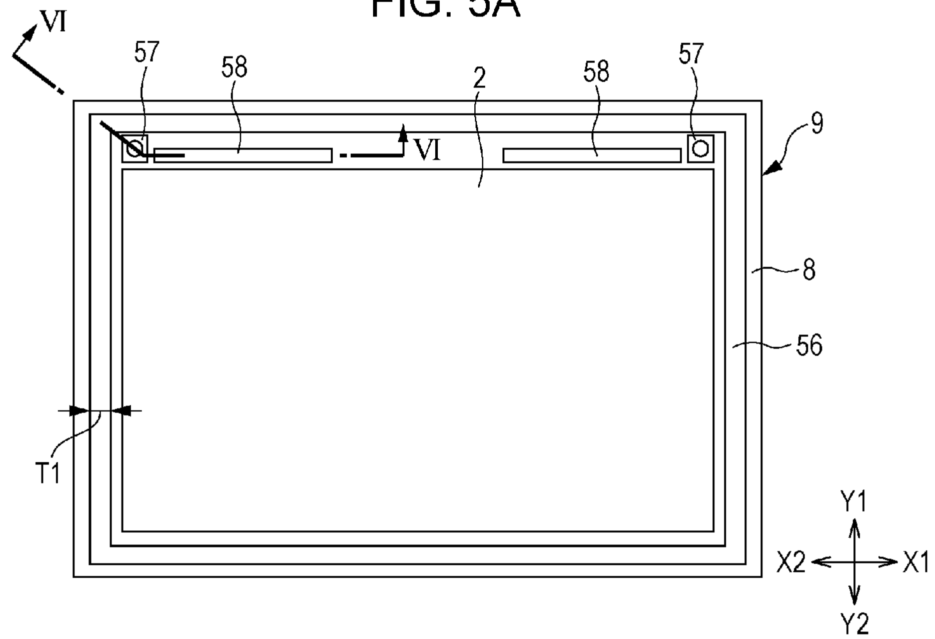
FIG. 5A is a partially transparent view illustrating a back side of the functional member.
Figure 5B:
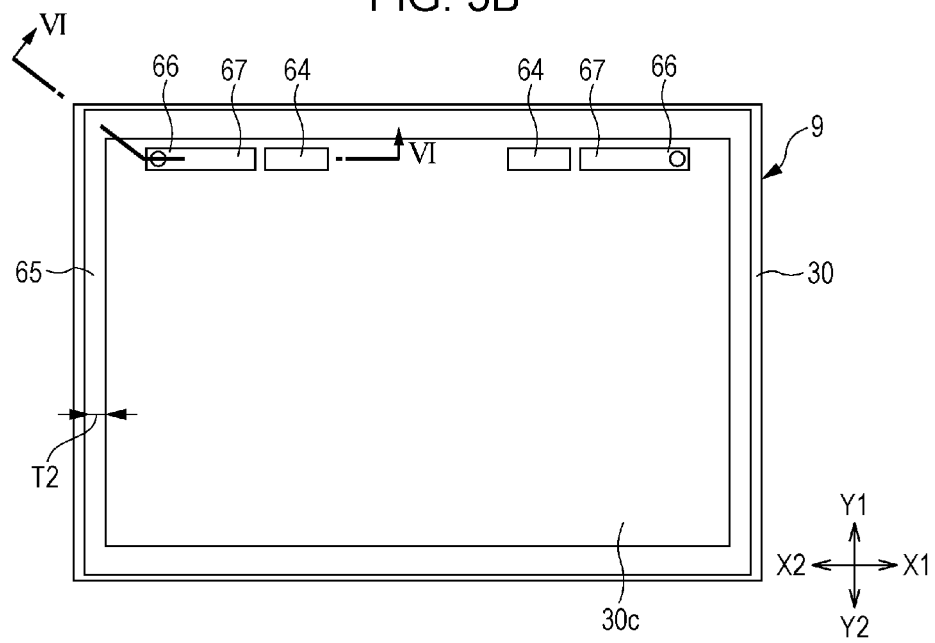
FIG. 5B is a partial plan view illustrating a front side of a wiring substrate.

FIG. 5A is a partially transparent view illustrating a back side of the functional member 9 illustrated in FIG. 1. The movable portion 2 and the anchor portions 5 to 7, which are illustrated in FIG. 1, are not illustrated in FIG. 5A. FIG. 5B is a partial plan view illustrating a front side of the wiring substrate 30. The fixed electrode 37, protrusions formed on the insulation layer 30*b* at positions at which the protrusions face the anchor portions 5 to 7, and metal layers on the protrusions, which are illustrated in FIG. 2, are not illustrated in FIG. 5B.

Figure 6:
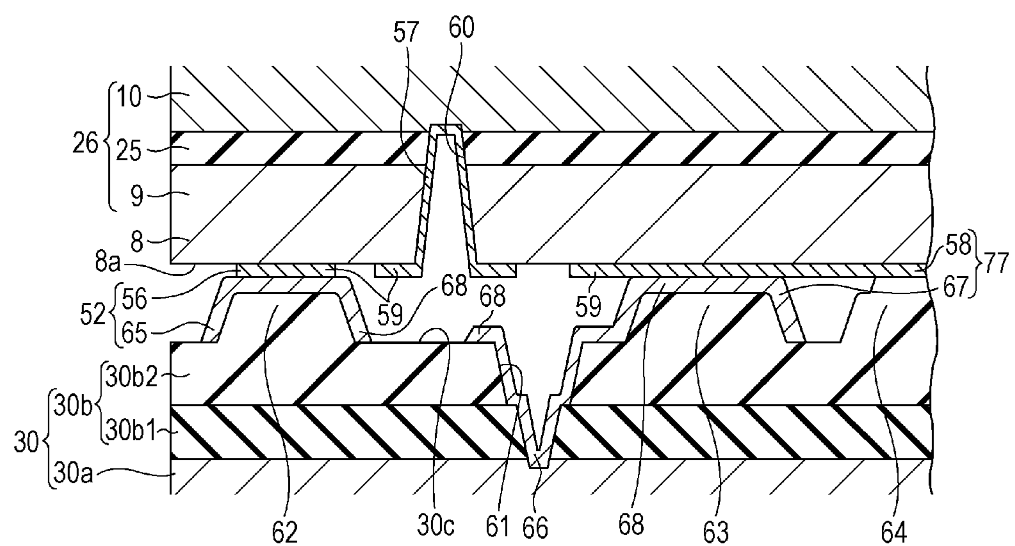
FIG. 6 is a partial enlarged longitudinal sectional view of the physical quantity sensor, which includes a sensor substrate including the functional member illustrated in FIG. 5A and a wiring substrate illustrated in FIG. 5B, taken along line VI-VI of FIGS. 5A and 5B.

FIG. 6 is a partial enlarged longitudinal sectional view of the physical quantity sensor, which includes the sensor substrate 26 including the functional member 9 illustrated in FIG. 5A and the wiring substrate 30 illustrated in FIG. 5B, taken along line VI-VI of FIGS. 5A and 5B.

As illustrated in FIGS. 5A and 6, a first sealing layer 56 is formed on a back surface 8*a* (a facing surface facing the wiring substrate 30) of the frame portion 8. The first sealing layer 56 has a frame-like shape and surrounds the movable portion 2.

As illustrated in FIGS. 5A and 6, first contact layers 57 are formed on the back surface 8*a* of the frame portion 8 inside of the first sealing layer 56 (between the movable portion 2 and the first sealing layer 56).

As illustrated in FIGS. 5A and 6, the first contact layers 57 are separated from the first sealing layer 56.

As illustrated in FIG. 6, each of the first contact layers 57 extends through the frame portion 8 (functional member 9) and the oxide insulation layer 25, and is electrically connected to the frame portion 8 and a surface of the first base member 10.

As illustrated in FIGS. 5A and 6, first electrical connection layers 58 are formed on the back surface 8*a* of the frame portion 8 inside of the first sealing layer 56 (between the movable portion 2 and the first sealing layer 56).

As illustrated in FIGS. 5A and 6, the first electrical connection layers 58 are separated from the first sealing layer 56 and the first contact layers 57. Alternatively, the first electrical connection layers 58 may be connected to the first contact layers 57.

The positions, the shapes in plan view and the numbers of the first contact layers 57 and the first electrical connection layers 58 may be different from those illustrated in FIG. 5A. However, with the structure illustrated in FIG. 5A, the limited region between the movable portion 2 and the first sealing layer 56 can be efficiently used, and thereby the physical quantity sensor can be reduced in size.

The first sealing layer 56, the first contact layers 57, and the first electrical connection layers 58 are made from a first metal layer 59. It is preferable that the first metal layer 59 include Ge, Mg, or Zn. In particular, it is preferable that the first metal layer 59 include Ge. The first metal layer 59 may have a single-layer structure or a stacked structure. The first metal layer 59 can be made by sputtering or the like.

As illustrated in FIG. 6, in the first contact layer 57, a through-hole 60 extends through the frame portion 8 and the oxide insulation layer 25. The first metal layer 59 is formed so as to extend from the back surface 8*a* of the frame portion 8 to an inner surface of the through-hole 60. The inside of the first contact layer 57 is not completely filled with the first metal layer 59, and a part of the through-hole 60 is left in the first contact layer 57. Alternatively, substantially the entirety of the inside of the through-hole 60 may be filled with the first metal layer 59. The first metal layer 59 is also formed on a back surface of each of the anchor portions 5 to 7 illustrated in FIG. 2.

As illustrated in FIGS. 5B and 6, the insulation layer 30*b*, which is formed on a surface of the second base member 30*a* of the wiring substrate 30, has a stacked structure including a lower insulation layer 30*b*1 and an upper insulation layer 30*b*2.

The lower insulation layer 30*b*1 is made of, for example, $SiO_2$. The upper insulation layer 30*b*2 is made of, for example, SiN. Thus, the height dimensions of through-holes 61 formed in the insulation layer 30*b* and the height dimensions of protrusion 62 to 64 formed on the insulation layer 30*b* can be made substantially uniform.

As illustrated in FIGS. 5B and 6, the protrusion 62 is formed on the surface 30*c* of the insulation layer 30*b* at a position at which the protrusion 62 faces the first sealing layer 56, and a second sealing layer 65 is formed on a surface of the protrusion 62. As illustrated in FIG. 5A, the first sealing layer 56 has a pattern width T1. As illustrated in FIG. 5B, the second sealing layer 65 has a pattern width T2, which is greater than T1.

As illustrated in FIGS. 5B and 6, second contact layers 66 are formed on the surface 30*c* of the insulation layer 30*b* inside of the second sealing layer 65.

As illustrated in FIGS. 5B and 6, the second contact layers 66 are formed so as to be separated from the second sealing layer 65.

As illustrated in FIG. 6, each of the second contact layers 66 extends through the insulation layer 30*b* and is electrically connected to a surface of the second base member 30*a*.

As illustrated in FIGS. 5B and 6, the protrusion 63 is formed on the surface 30*c* of the insulation layer 30*b* at a position at which the protrusion 63 faces the first electrical connection layer 58. A second electrical connection layer 67, which extends from the second contact layer 66, is formed on a surface of the protrusion 63.

As illustrated in FIGS. 5B and 6, each of the second electrical connection layers 67 has a length (dimension in the X1-X2 direction) that is less than the length of the first electrical connection layer 58. The protrusion 64 is formed adjacent to the second electrical connection layer 67 at a position at which the protrusion 64 faces the first electrical connection layer 58. The protrusion 64 functions as a bonding stopper portion.

As illustrated in FIG. 6, the protrusion 64 protrudes the most. The protrusions 62 and 63 have the same height, which is lower than the height of the protrusion 64. The height of the protrusion 64 is the same as or slightly lower than that of the top of a second metal layer 68 so that the protrusion 64 can function as a bonding stopper portion as described above.

The positions, the shapes in plan view, and the numbers of the second contact layer 66 and the second electrical connection layer 67 are determined in accordance with those of the first contact layer 57 and the first electrical connection layer 58.

As illustrated in FIG. 6, the first contact layer 57 and the second contact layer 66 are disposed so as to be displaced from each other in the horizontal direction. This is because the second sealing layer 65 is wider than the first sealing layer 56 and because it is necessary to separate the second contact layer 66 from the second sealing layer 65 further by efficiently using a usable region on the surface 30*c* of the wiring substrate 30 (a region between the fixed electrode 37 and the second sealing layer 65 illustrated in FIG. 2).

The second sealing layer 65, the second contact layers 66, and the second electrical connection layers 67 are made from the second metal layer 68. It is preferable that the second metal layer 68 include Al, an Al alloy, or the like. Examples of an Al alloy include an Al—Cu alloy. The second metal layer 68 may have a single-layer structure or a stacked structure. Examples of a stacked structure include Ta/Al—Cu/Ge. The second metal layer 68 can be made by sputtering or the like.

As illustrated in FIG. 6, in the second contact layer 66, the through-hole 61 extends through the insulation layer 30*b*. The second metal layer 68 is formed so as to extend from the surface 30*c* of the insulation layer 30*b* to an inner surface of the through-hole 61. The inside of the second contact layer 66 is not completely filled with the second metal layer 68, and a part of the through-hole 61 is left in the second contact layer 66. Alternatively, substantially the entirety of the inside of the through-hole 61 may be filled with the second metal layer 68.

The second metal layer 68 is also formed on a surface of each of the protrusions formed on a surface of the insulation layer 30*b* facing the anchor portions 5 to 7 illustrated in FIG. 2. The second metal layer 68 is also formed as the fixed electrode 37 (see FIG. 2). However, the material and the thickness of the second metal layer 68 formed as the fixed electrode 37 may be different from those of the other second metal layers 68. That is, the second metal layer 68 formed as the fixed electrode 37 and the second metal layers 68 formed as the second sealing layer 65, the second contact layers 66, and the second electrical connection layers 67 can be formed in different manufacturing steps. It is preferable that the fixed electrode 37 have a thickness less than that of any of the second sealing layer 65, the second contact layers 66, and the second electrical connection layers 67. This is because the range of movement of the movable portion 2 (weight portion 2*a*) in the height direction can be increased with this structure.

The sealing layer 52 is formed by eutectically bonding the first sealing layer 56 (first metal layer 59) and the second sealing layer 65 (second metal layer 68), which are illustrated in FIGS. 2 and 6, to each other. The bonding layer 50 is formed by eutectically bonding the first metal layer 59 and the second metal layer 68, which are disposed between each of the anchor portions 5 to 7 and the wiring substrate 30, to each other. An electrical connection layer 77 is formed by eutectically bonding the first electrical connection layer 58 (first metal layer 59) and the second electrical connection layer 67 (second metal layer 68) to each other.

Figure 7A:
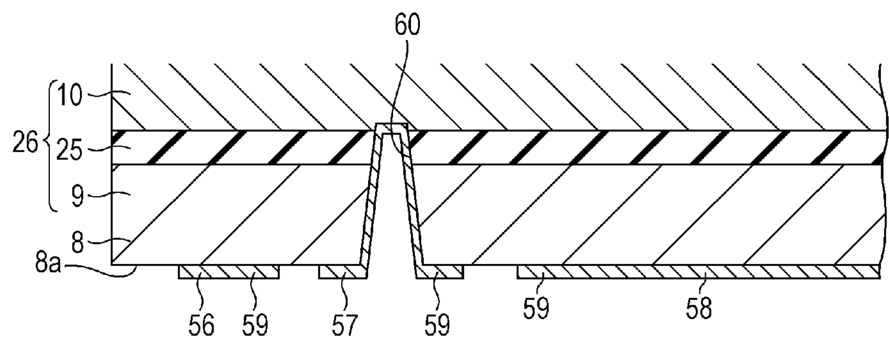
FIGS. 7A to 7C illustrate the steps of a method of making the physical quantity sensor according to the present embodiment (partial longitudinal sectional views)
Figure 7B:
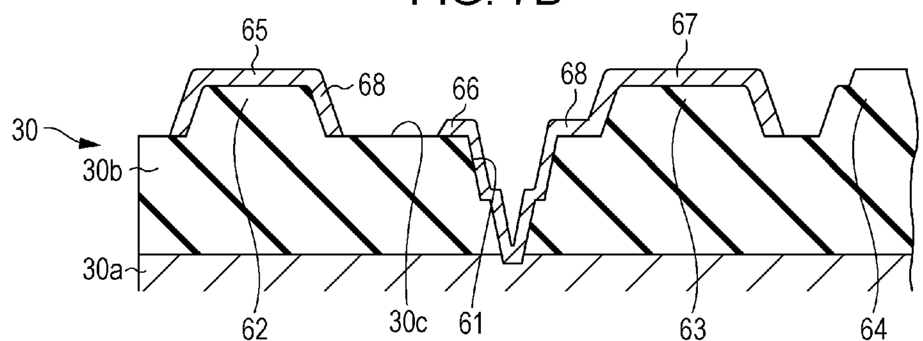
Figure 7C:
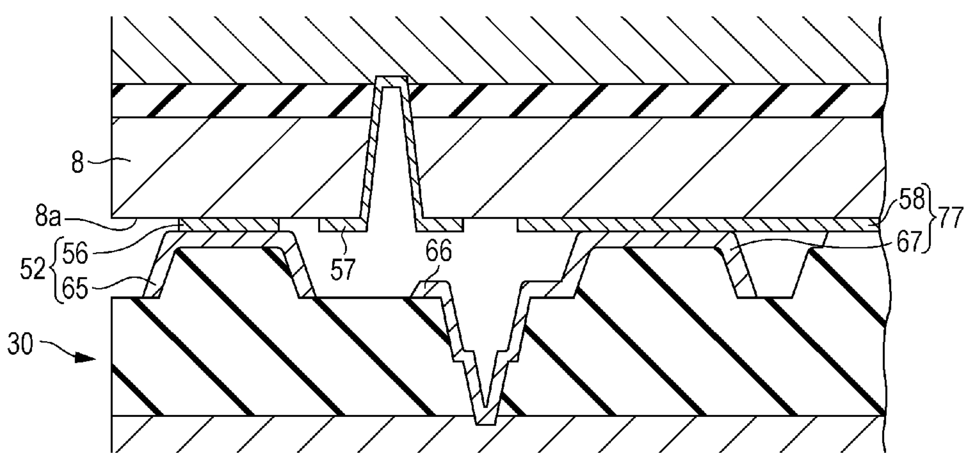

FIGS. 7A to 7C illustrate the steps of a method of making the physical quantity sensor according to the present embodiment. Each of FIGS. 7A to 7C is a partial longitudinal sectional view of the physical quantity sensor during a corresponding one of the steps.

In the step illustrated in FIG. 7A, the sensor substrate 26 is formed. As the sensor substrate 26, an SOI substrate including the electroconductive first base member 10 (silicon substrate), the oxide insulation layer 25 ($SiO_2$ layer; first insulation layer), and the electroconductive functional member 9 (silicon substrate) is used.

The functional member 9 of the SOI substrate is cut into the components illustrated in FIG. 1 by deep RIE. Although not illustrated in FIGS. 1 and 7A, a large number of pores are formed in the movable portion 2, and parts of the oxide insulation layer 25 located between the movable portion 2 and the first base member 10 are removed through the pores.

As illustrated in FIG. 7A, the through-hole 60 is formed so as to extend through the frame portion 8 and the oxide insulation layer 25 to the first base member 10.

Next, the first metal layer 59 is formed on a predetermined region of the back surface of the functional member 9 by sputtering or the like. The first sealing layer 56, the first contact layer 57, and the first electrical connection layer 58 are formed on the back surface 8*a* of the frame portion 8 from the first metal layer 59. At this time, at least the first sealing layer 56 and the first contact layer 57 are formed so as to be separated from each other. The first contact layer 57 and the first electrical connection layer 58 are formed inside of the first sealing layer 56 (between the first sealing layer 56 and the movable portion 2). The first metal layer 59 is formed also on the back surface of each of the anchor portions 5 to 7.

It is preferable that the first metal layer 59 be formed from a material including Ge, Mg, or Zn. In particular, it is preferable that the material include Ge.

In the step illustrated in FIG. 7B, the wiring substrate 30 is formed. The insulation layer 30*b* (second insulation layer) is formed on a surface of the electroconductive second base member 30*a* (silicon substrate) of the wiring substrate 30. The insulation layer 30*b* has, for example, a stacked structure illustrated in FIG. 6. The wiring layer 51 (see FIG. 2) is formed in the insulation layer 30*b*. The protrusions 62 to 64 are formed on the surface 30*c* of the insulation layer 30*b* by etching. The through-hole 61 is formed so as to extend through the insulation layer 30*b* to the second base member 30*a*.

Next, the second metal layer 68 is formed on a predetermined region of the surface of the insulation layer 30*b* by sputtering or the like. The second sealing layer 65, the second contact layer 66, and the second electrical connection layer 67 are formed on the surface 30*c* of the insulation layer 30*b* from the second metal layer 68. At this time, the second sealing layer 65 and the second contact layer 66 are formed so as to be separated from each other. The second contact layer 66 and the second electrical connection layer 67 are integrally formed with each other. The second sealing layer 65 is formed on the protrusion 62, which is disposed at a position at which the protrusion 62 faces the first sealing layer 56. The second electrical connection layer 67 is formed so as to cover the protrusion 63, which is formed in the surface 30*c* of the insulation layer 30*b*. The second metal layer 68 is also formed on the surface of protrusion, which is formed at a position at which the protrusion faces a corresponding one of the anchor portions 5 to 7. Moreover, the fixed electrode 37 (see FIG. 2) is formed. The material and structure of the second metal layer 68 formed as the fixed electrode 37 may be different from those of the other second metal layers 68.

It is preferable that the second metal layer 68 be made of a material including Al or an Al alloy. An Al—Cu alloy can be preferably used as an Al alloy.

In the step illustrated in FIG. 7C, the sensor substrate 26 made in the step of FIG. 7A and the wiring substrate 30 made in the step of FIG. 7B are made to face each other and are pressed against each other at a predetermined heat treatment temperature. Accordingly, the sealing layer 52 can be formed by eutectically bonding the first sealing layer 56 (first metal layer 59) on the back surface 8*a* of the frame portion 8 and the second sealing layer 65 (second metal layer 68) on the surface 30*c* of the insulation layer 30*b* to each other. Thus, a gap between the frame portion 8 and the wiring substrate 30 can be appropriately sealed.

The electrical connection layer 77 can be formed by eutectically bonding the first electrical connection layer 58 (first metal layer 59) on the back surface 8*a* of the frame portion 8 and the second electrical connection layer 67 (second metal layer 68) on the surface 30*c* of the insulation layer 30*b* to each other.

Furthermore, the bonding layer 50 (see FIG. 2) can be formed by eutectically bonding the first metal layers 59 on the back surfaces of the anchor portions 5 to 7 and the second metal layer 68 on the wiring substrate 30 to each other.

As described above, with the present embodiment, the first sealing layer 56 and the first contact layers 57 are separated from each other, and the second sealing layer 65 and the second contact layers 66 are separated from each other. With the present embodiment, as illustrated in FIG. 6 and other figures, the sensor substrate 26 includes the oxide insulation layer 25 and the wiring substrate 30 includes the insulation layer 30*b*. Therefore, with the present invention, the contact layers 57 and 66, which are separated from the sealing layers 56 and 65, can be respectively electrically connected to the functional member 9 and the base members 10 and to the base member 30*a* through the insulation layers 25 and 30*b*. The first contact layers 57 and the second contact layers 66 are electrically connected to each other. Accordingly, the first base member 10, the second base member 30*a*, and the frame portion 8, which is a part of the functional member 9 excluding the movable portion 2 (electrode portion), can be made to have the same potential. Thus, stray capacitance generated in the physical quantity sensor can be appropriately removed, and thereby a highly accurate output can be obtained. By using the contact layers 57 and 66, which extend through the insulation layers, for electrical connection, the limited area in the physical quantity sensor can be efficiently used, and thereby the physical quantity sensor can be reduced in size.

Moreover, with the present embodiment, the following advantage can be obtained because the first sealing layer 56 and the first contact layer 57 are separated from each other and the second sealing layer 65 and the second contact layer 66 are separated from each other.

Figure 8A:
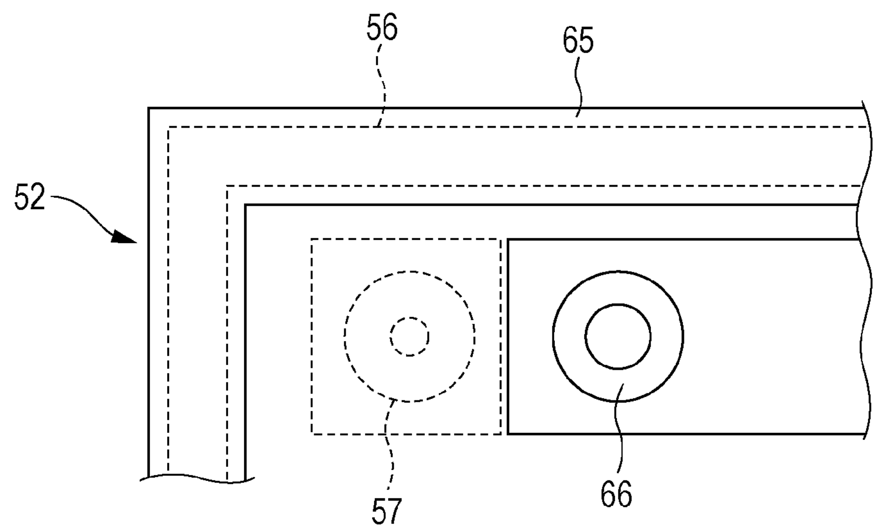
FIG. 8A is a partial enlarged plan view of the physical quantity sensor according to the present embodiment, illustrating a first sealing layer and a first contact layer formed on the functional member and a second sealing layer and a second contact layer formed on the wiring substrate, which are superposed on each other.

FIG. 8A is a partial enlarged plan view of the physical quantity sensor according to the present embodiment, illustrating the first sealing layer 56 and the first contact layer 57 formed on the functional member 9 and the second sealing layer 65 and the second contact layer 66 formed on the wiring substrate 30, which are superposed on each other.

Figure 8B:
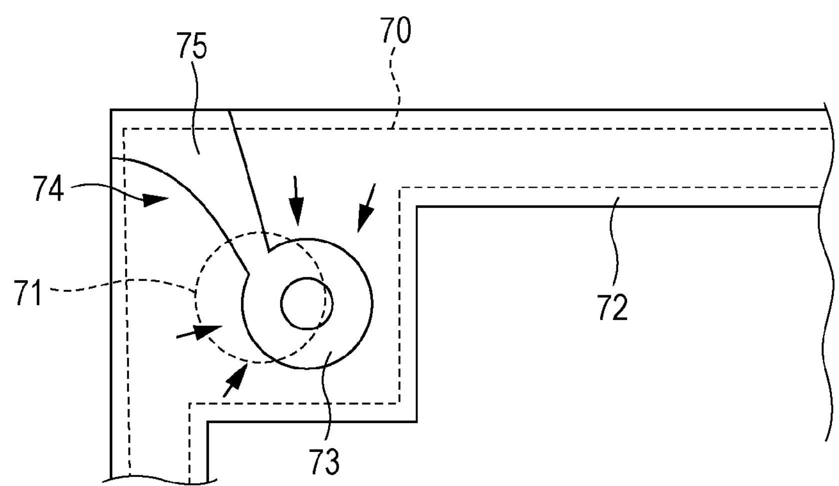
FIG. 8B is a partial enlarged plan view of a physical quantity sensor according to a comparative example, illustrating a first sealing layer and a first contact layer formed on a functional member and a second sealing layer and a second contact layer formed on a wiring substrate, which are superposed on each other.

FIG. 8B is a partial enlarged plan view of a physical quantity sensor according to a comparative example, illustrating a first sealing layer 70 and a first contact layer 71 formed on a functional member and a second sealing layer 72 and a second contact layer 73 formed on a wiring substrate, which are superposed on each other.

As illustrated in FIG. 8B, the first sealing layer 70 and the first contact layer 71 are integrally formed with each other, and the second sealing layer 72 and the second contact layer 73 are integrally formed with each other. That is, the comparative example differs from the present embodiment illustrated in FIG. 8A in that the first sealing layer 70 and the first contact layer 71 are not separated from each other and the second sealing layer 72 and the second contact layer 73 are not separated from each other.

For example, the first sealing layer 70 and the first contact layer 71 are made of Ge, and the second sealing layer 72 and the second contact layer 73 are made of Al. By eutectically bonding the first sealing layer 70 and the second sealing layer 72 by pressing these layers against each other while performing predetermined heat treatment, the first contact layer 71 and the second contact layer 73 become electrically connected to each other through the sealing layers 70 and 72.

However, with the structure of the comparative example, due to the heat treatment for eutectic bonding, Al becomes softened and flows toward the second contact layer 73 as indicated by arrows in FIG. 8B. In particular, a metal easily flows toward the second contact layer 73 because, the second contact layer 73 is located lower than the sealing layers 70 and 72 due to the presence of protrusions formed on the insulation layer on the wiring substrate as illustrated in FIG. 6. As a result, a void 75 is likely to be formed in a sealing layer 74, which has been formed by eutectically bonding the sealing layers 70 and 72 to each other, gas and liquid are likely to leak into the sensor through the void 75, and therefore this structure has a problem in that at the reliability of the sensor decreases.

In contrast, with the present embodiment, as illustrated in FIG. 8A, the first sealing layer 56 and the first contact layer 57 are separated from each other, and the second sealing layer 65 and the second contact layer 66 are separated from each other. Therefore, when eutectically bonding the first sealing layer 56 and the second sealing layer 65 to each other by pressing these layers against each other while performing predetermined heat treatment, a metal that is included in the sealing layers 56 and 65 and that easily softens (such as Al) can be prevented from flowing toward the contact layers. As illustrated in FIG. 6, although the second sealing layer 65 is located higher than the second contact layer 66, the second sealing layer 65 and the second contact layer 66 are not connected to each other. Therefore, softened metal does not flow from the second sealing layer 65 toward the second contact layer 66. As a result, the first sealing layer 56 and the second sealing layer 65 can be eutectically bonded to each other appropriately, the void 75 illustrated in FIG. 8B is prevented from being generated in the sealing layer 52, and the gap between the frame portion 8 of the functional member 9 and the wiring substrate 30 can be appropriately sealed.

Thus, with the present embodiment, as compared with existing technologies, improvement of the electrical stability of the physical quantity sensor, such as reduction of parasitic capacity and reduction of noise, can be achieved. Moreover, a metal included in the sealing layer is prevented from flowing toward the contact layer when eutectic bonding is performed, a gap between the substrates can be appropriately sealed, and thereby the reliability of the physical quantity sensor can be improved.

As illustrated in FIG. 6, the first electrical connection layer 58 formed from the first metal layer 59 and the second electrical connection layer 67 formed from the second metal layer 68 are provided in the present embodiment. The first electrical connection layer 58 and the second electrical connection layer 67 can be eutectically bonded to each other. In this case, it is necessary that the second contact layer 66 and the second electrical connection layer 67 be connected to each other. If the second contact layer 66 and the second electrical connection layer 67 are separated from each other, these layers are insulated from each other by the insulation layer 30*b* disposed therebetween. On the other hand, the first contact layer 57 and the first electrical connection layer 58 may be separated from each other as illustrated in FIG. 6. The first contact layer 57 and the first electrical connection layer 58 are electrically connected to each other through the electroconductive functional member 9, which is a silicon substrate. Whether or not to separate the first contact layer 57 and the first electrical connection layer 58 from each other may be determined in accordance with the structure of the physical quantity sensor and the like. If the first contact layer 57 and the first electrical connection layer 58 can be electrically connected to each other through the functional member 9 without causing any problems, it is preferable that the first contact layer 57 and the first electrical connection layer 58 be separated from each other. In this case, the first contact layer 57 can be made completely independent from other layers. For example, when Al or an Al alloy is used as the material of the first metal layer 59 and Ge, Mg, or Zn is used as the material of the second metal layer 68, a metal is likely to flow toward the first contact layer 57. By forming the first contact layer 57 to be completely independent, flow of metal toward the first contact layer 57 can be appropriately prevented. On the other hand, the second contact layer 66 is connected to the first electrical connection layer 58 and the second electrical connection layer 67, which are eutectically bonded to each other. Therefore, when these layers are eutectically bonded to each other, a metal that easily softens may flow toward the second contact layer 66, and thereby a void is likely to be formed in the electrical connection layer 77, which includes the first electrical connection layer 58 and the second electrical connection layer 67. However, no functional problem occurs even if a void is formed in the electrical connection layer 77. The present embodiment prevents a void from being formed in the sealing layer 52, and even if a void is formed in the electrical connection layer 77, which is located inside of the sealing layer 52, hermeticity between substrates is not impaired.

The amount of extra space on the first sealing layer 56 side is smaller than that on the wiring substrate 30 side, because it is necessary to form the movable portion 2 in the functional member 9. Therefore, by making the pattern width T1 of the first sealing layer 56 be less than the pattern width T2 of the second sealing layer 65 as illustrated in FIG. 5A, the components can be efficiently formed and arranged.

The structure according to the present embodiment, in which the sealing layer and the contact layer are separated from each other, can also be used in modifications of the present embodiment and in other embodiments.

Figure 9:
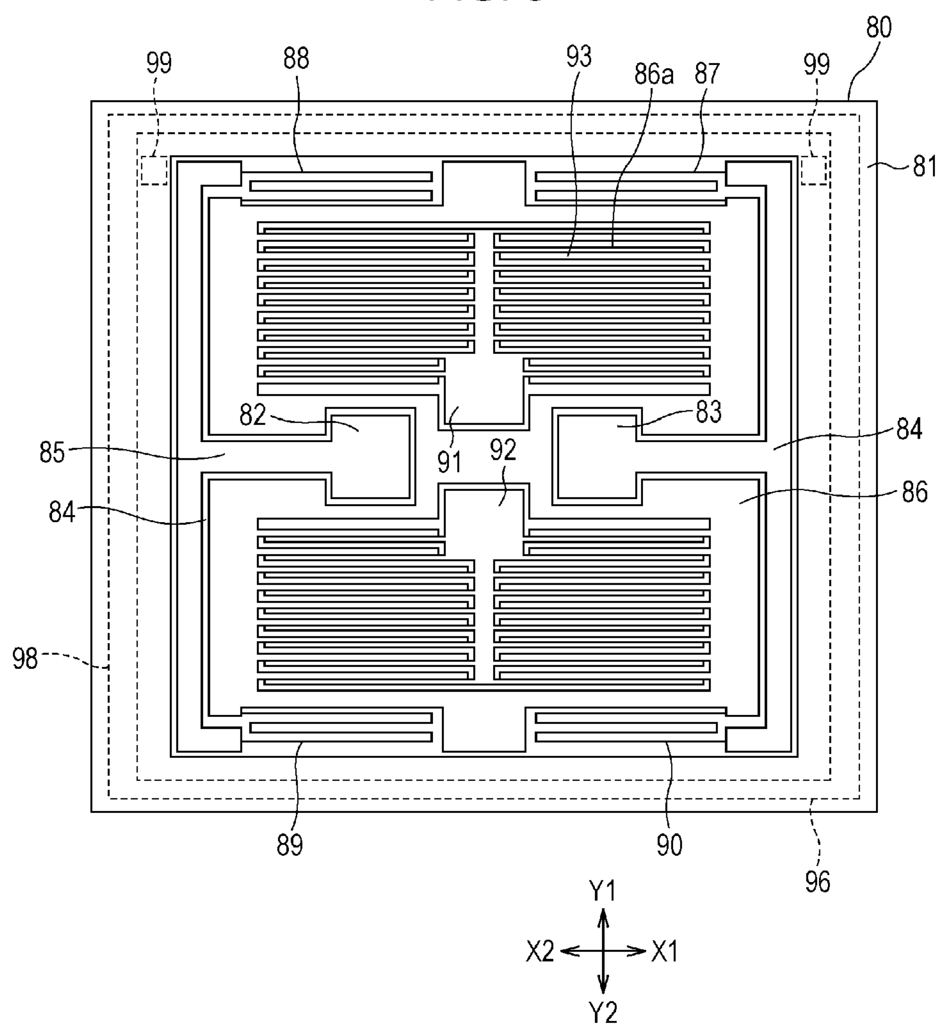
FIG. 9 is a plan view of a physical quantity sensor according to a modification of the embodiment illustrated in FIG. 1 (plan view of a functional member)

FIG. 9 is a plan view of a physical quantity sensor 80 according to a modification of the embodiment illustrated in FIG. 1. In FIG. 9, the physical quantity sensor 80 includes a silicon substrate 81 (functional member) in which anchor portions 82 and 83, support arms 84 and 85 integrally extending from the anchor portions 82 and 83, a weight portion 86, and a frame portion 96 are formed by deep RIE so as to be separated from each other. Comb-teeth-like movable electrodes 86*a* are integrally formed with the weight portion 86. (In FIG. 9, only one of the movable electrodes is denoted by the numeral 86*a*.) The weight portion 86 is connected to the support arms 84 and 85 through spring portions 87 to 90.

Moreover, as illustrated in FIG. 9, in the silicon substrate 81 (functional member), comb-teeth-like fixed electrodes 93 are formed by deep RIE so as to be separated from the weight portion 86. The fixed electrodes 93 are integrally formed with anchor portions 91 and 92, and the fixed electrodes 93 and alternately arranged with the movable electrodes 86*a*. (In FIG. 9, only one of the fixed electrodes is denoted by the numeral 93.)

The physical quantity sensor 80 according to the modification can be used as an acceleration sensor for detecting acceleration in the Y1 direction or the Y2 direction.

As illustrated in FIG. 9, a gap between the frame portion 96 surrounding the weight portion 86 and a wiring substrate (not shown) facing the frame portion 96 is sealed by eutectically bonding a first metal layer and a second metal layer to each other. Contact layers 99 are formed so as to extend through a sealing layer 98 of the frame portion 96 and so as to be separated from the insulation layer. Contact layers (not shown) are formed so as to extend through an insulation layer and so as to be separated from a sealing layer (not shown) of a wiring substrate.

Figure 10A:
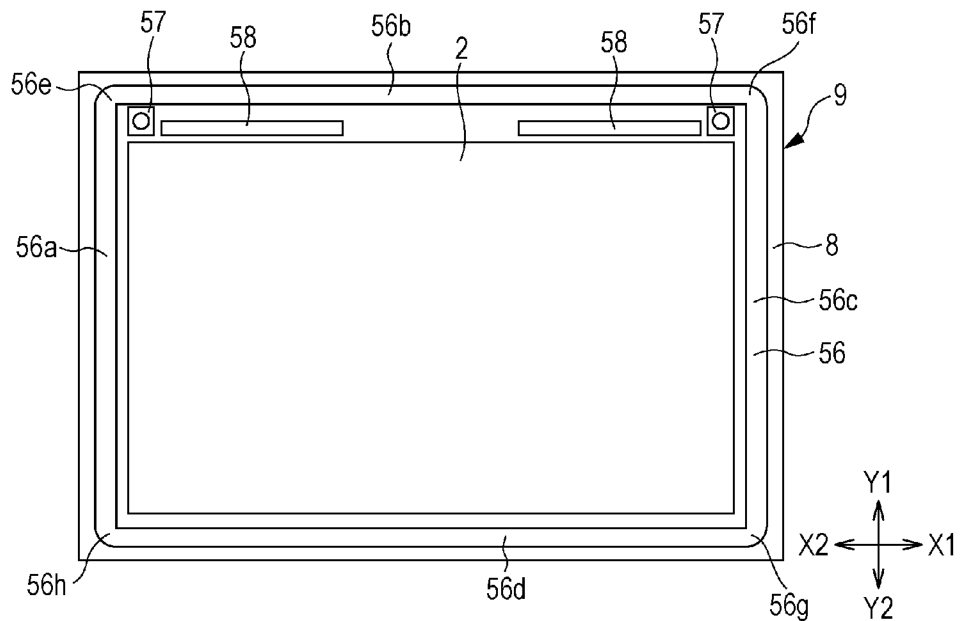
FIGS. 10A and 10B illustrate a physical quantity sensor according to a second embodiment of the present invention.
Figure 10B:
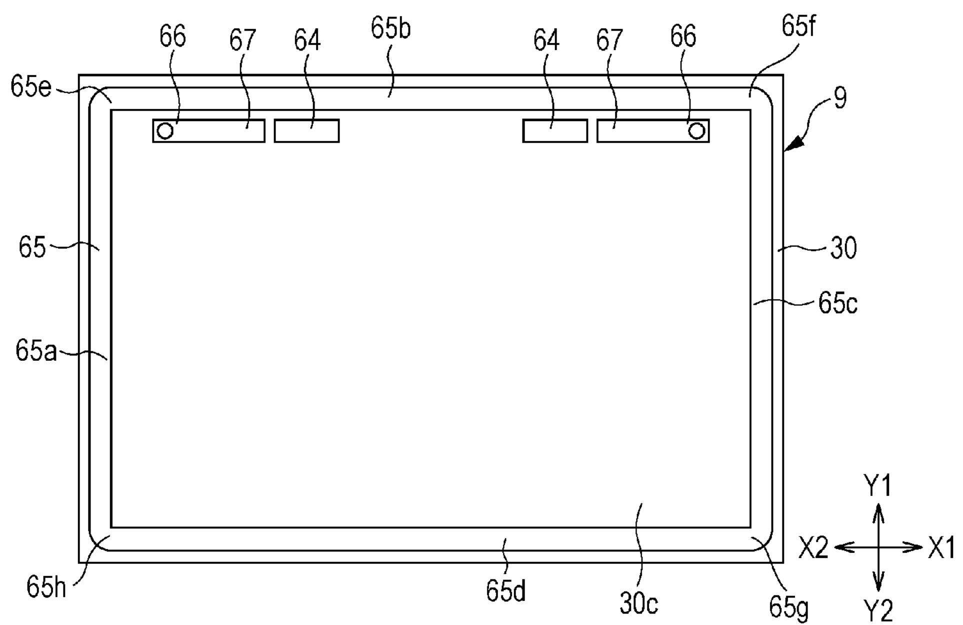

FIGS. 10A and 10B illustrate a physical quantity sensor according to a second embodiment of the present invention, FIG. 10A is a partially transparent view illustrating a back side of a functional member, and FIG. 10B is a partial plan view illustrating a front side of a wiring substrate. The numerals the same as those of FIGS. 5A and 5B denote the same components as those of FIGS. 5A and 5B.

As illustrated in FIG. 10A, the sealing layer 56 includes parallel portions 56*a* and 56*c*, each having a linear strip-like shape and extending in the Y1-Y2 direction; parallel portions 56*b* and 56*d*, each having a linear strip-like shape and extending in the X1-X2 direction; and curved portions 56*e* to 56*h*, which connect the parallel portions to each other. Likewise, as illustrated in FIG. 10B, the sealing layer 65 includes parallel portions 65*a* to 65*d* and curved portions 65*e* to 65*h*. The structure illustrated in FIGS. 10A and 10B differs from that of FIGS. 5A and 5B in that the four corners of the sealing layers 56 and 65 have curved shapes and therefore the sealing layers 56 and 65 each have a substantially constant width. Therefore, a substantially uniform bonding pressure can be applied to bonding surfaces of the sealing layers 56 and 65. As a result, an unbonded region and a void can be prevented from being generated on the bonding surface, the entireties of the sealing layers 56 and 65 can be appropriately bonded to each other as compared with the structure of FIGS. 5A and 5B, and a physical quantity sensor having higher hermeticity can be realized. The structure in which the sealing layers 56 and 65 each have a substantially constant width can be realized by separating the first contact layer 57 and the second contact layer 66 from the sealing layers 56 and 65.

Instead of the shapes illustrated in FIGS. 10A and 10B, each of the sealing layers 56 and 65 may have another shape having a substantially constant width, such as a shape having circular or elliptical outer and inner peripheries.

The present embodiment can be applied to any physical quantity sensor other than an acceleration sensor, such as an angular velocity sensor or a shock sensor.

EXAMPLE

Figure 11:
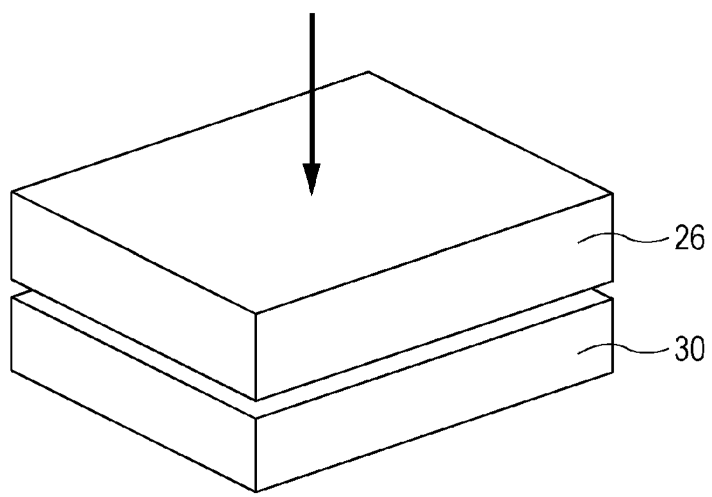
FIG. 11 illustrates a model used in a simulation test.

FIG. 11 illustrates the sensor substrate 26 and the wiring substrate 30 of a model used in a simulation test. The sensor substrate 26 was made by forming the first sealing layer 56 and the first electrical connection layer 58 each having a predetermined thickness and made of Ge on the back surface of a silicon substrate. The wiring substrate 30 was made by forming a SiN layer on a surface of a silicon substrate and forming the second sealing layer 65 and the second electrical connection layer 67 each having a predetermined thickness and made of Al on a surface of the SiN layer.

In the invention example, the sealing layers 56 and 65 had shapes illustrated in FIGS. 10A and 10B. In the comparative example, the sealing layers each had four corners having angular shapes and larger widths, and the contact layers were integrally formed with the sealing layers.

It was assumed that the Young's modulus and the Poisson's ratio of Si (silicon) were respectively 178000 MPa and 0.28, the Young's modulus and the Poisson's ratio of Al were respectively 70300 MPa and 0.35, the Young's modulus and the Poisson's ratio of Ge were respectively 102700 MPa and 0.28, and the Young's modulus and the Poisson's ratio of SiN were respectively 374000 MPa and 0.28.

A pressure was applied to the sensor substrate 26 and the wiring substrate 30 as indicated by an arrow of FIG. 11. The pressure was in the range of 1 to 10 MPa.

Figure 12A:
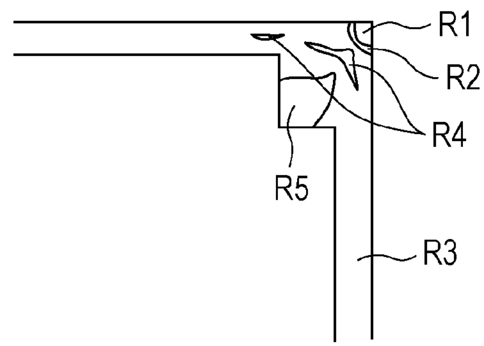
FIGS. 12A and 12B illustrate the distribution of bonding pressure of the comparative example, obtained by performing the simulation test.
Figure 12B:
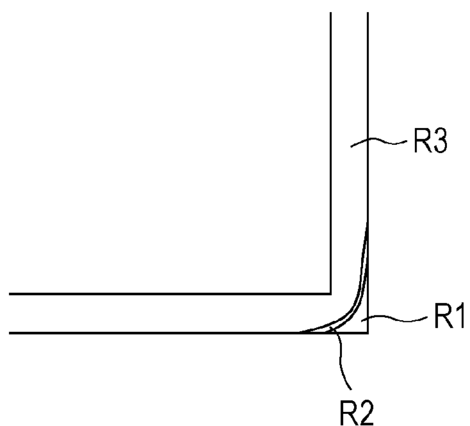

FIGS. 12A and 12B illustrate the distribution of bonding pressure acting on a bonding surface of a sealing layer of the comparative example. In FIG. 12A, the bonding pressure was the strongest in region R1, and the bonding pressure decreased in the order of region R2, region R3, regions R4, and region R5. Also in FIG. 12B, the bonding pressure was the strongest in region R1, and the bonding pressure decreased in the order of region R2 and region R3.

Figure 13:
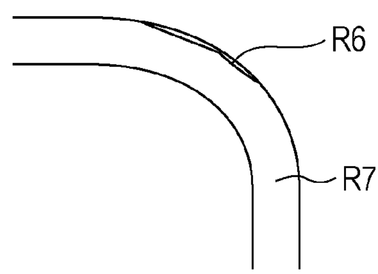
FIG. 13 illustrates the distribution of bonding pressure of an invention example, obtained by performing the simulation test.

FIG. 13 illustrates the distribution of bonding pressure acting on a bonding surface of a sealing layer of the invention example. In FIG. 13, the bonding pressure in region R6 was higher than that in region R7. However, because region R7 occupies most of the area of the bonding surface, it was confirmed that the variation of the bonding pressure was smaller than that of the comparative example illustrated in FIGS. 12A and 12B and a substantially uniform bonding pressure was applied to the entirety of the bonding surface.

It was found that the difference in the bonding pressure is likely to occur in the corner portion of the comparative example as illustrated in FIGS. 12A and 12B. Due to the difference in the bonding pressure, an unbonded portion or a void is likely to be formed in a portion in which the bonding pressure is too low. It was found that, by forming the four corners so as to be curved and making the width of the bonding surface be substantially constant as in the invention example, a substantially constant bonding pressure can be applied to the entirety the bonding surface. Thus, the entireties of the sealing layer of the sensor substrate and the sealing layer of the wiring substrate can be appropriately bonded to each other, and thereby a physical quantity sensor having high hermeticity can be realized.

What is claimed is:

1. A physical quantity sensor comprising:

an electroconductive first base member;

an electroconductive second base member;

an electroconductive functional member including:

a movable portion disposed between the first base member and the second base member; and a frame portion surrounding the movable portion;

a detection portion configured to detect displacement of the movable portion;

a first insulation layer bonding the frame portion and the first base member to each other;

a first metal layer formed on a facing surface of the functional member facing the second base member, the first metal layer including a first sealing layer formed on the facing surface of the frame portion and having a frame-like shape, and a first contact layer separated from the first sealing layer, extending through the functional member and the first insulation layer, and electrically connected to the frame portion and the first base member;

a second insulation layer formed on a facing surface of the second base member facing the functional member; and a second metal layer formed on a surface of the second insulation layer, the second metal layer including a second sealing layer formed at a position at which the second sealing layer faces the first sealing layer, and a second contact layer separated from the second sealing layer, extending through the second insulation layer, and electrically connected to the second base member, wherein a gap between the frame portion and the second base member is sealed by eutectically bonding the first sealing layer and the second sealing layer to each other, and wherein the first contact layer and the second contact layer, respectively separated from the first sealing layer and the second sealing layer, are electrically connected to each other, and thereby the first base member, the second base member, and the frame portion are made to have the same potential.

2. The physical quantity sensor according to claim 1, wherein the first metal layer further includes a first electrical connection layer electrically connected to the first contact layer, wherein the second metal layer further includes a second electrical connection layer integrally formed with the second contact layer, and wherein the first electrical connection layer and the second electrical connection layer are eutectically bonded to each other, and thereby the first contact layer and the second contact layer are electrically connected to each other through the first electrical connection layer and the second electrical connection layer.

3. The physical quantity sensor according to claim 2, wherein the first and second contact layers and the first and second electrical connection layers are formed between the movable portion and the first and second sealing layers in plan view.

4. The physical quantity sensor according to claim 2, wherein the first electrical connection layer and the second electrical connection layer have different lengths, and a protruding bonding stopper portion is formed on a shorter one of the first and second electrical connection layers at a position at which the bonding stopper portion faces a longer one of the first end second electrical connection layers.

5. The physical quantity sensor according to claim 1, wherein the first sealing layer and the second sealing layer each have four corners having curved shapes.

6. The physical quantity sensor according to claim 1, wherein the first sealing layer and the second sealing layer each have a substantially constant width.

7. The physical quantity sensor according to claim 1, wherein the first metal layer includes Ge, Mg, or Zn and the second metal layer includes Al or an Al alloy, or the second metal layer includes Ge, Mg, or Zn and the first metal layer includes Al or an Al alloy.

8. A method of making a physical quantity sensor, the physical quantity sensor including an electroconductive first base member, an electroconductive second base member, an electroconductive functional member including:

a movable portion disposed between the first base member and the second base member; and a frame portion surrounding the movable portion, a detection portion configured to detect displacement the movable portion, and a first insulation layer bonding the frame portion and the first base member to each other, the method comprising:

forming a first metal layer on a facing surface of the functional member facing the second base member so that the first metal layer includes a first sealing layer formed on the facing surface of the frame portion and having a frame-like shape, and a first contact layer separated from the first sealing layer, extending through the functional member and the first insulation layer, and electrically connected to the frame portion and the first base member;

forming a second metal layer on a surface of a second insulation layer formed on a facing surface of the second base member facing the functional member so that the second metal layer includes a second sealing layer formed at a position at which the second sealing layer faces the first sealing layer, and a second contact layer separated from the second sealing layer, extending through the second insulation layer, and electrically connected to the second base member; and eutectically bonding the first sealing layer and the second sealing layer to each other, and making the first base member, the second base member, and the frame portion have the same potential by electrically connecting the first contact layer and the second contact layer, respectively separated from the first sealing layer and the second sealing layer, to each other.

9. The method of making the physical quantity sensor according to claim 8, wherein a first electrical connection layer is made from the first metal layer so as to be electrically connected to the first contact layer, wherein a second electrical connection layer is made from the second metal layer so as to extend from the second contact layer, and wherein the first contact layer and the second contact layer are electrically connected to each other through the first electrical connection layer and the second electrical connection layer by eutectically bonding the first electrical connection layer and the second electrical connection layer to each other.

10. The method of making the physical quantity sensor according to claim 9, wherein the first electrical connection layer and the second electrical connection layer are formed so as to have different lengths and so that a protruding bonding stopper portion is formed on a shorter one of the first and second electrical connection layers at a position at which the bonding stopper portion faces a longer one of the first end second electrical connection layers.

11. The method of making the physical quantity sensor according to claim 8, wherein four corners of each of the first sealing layer and the second sealing layer are formed so as to have curved shapes.

12. The method of making the physical quantity sensor according to claim 8, wherein each of the first sealing layer and the second sealing layer is formed so as to have a substantially constant width.

13. The method of making the physical quantity sensor according to claim 8, wherein the first metal layer is formed from a material including Ge, Mg, or Zn and the second metal layer is formed from a material including Al or an Al alloy, or the second metal layer is formed from a material including Ge, Mg, or Zn and the first metal layer is formed from a material including Al or an Al alloy.

* * * * *